United States Patent [19]
Hellegaard et al.

[11] Patent Number: 4,572,969
[45] Date of Patent: Feb. 25, 1986

[54] LOW POWER LOSS SNUBBER FOR SWITCHING POWER TRANSISTORS

[75] Inventors: Kjeld Hellegaard, Nordborg; Hans Doktor, Egå; Niels O. Jacobsen, Hornslet, all of Denmark

[73] Assignee: Danfoss A/S, Nordborg, Denmark

[21] Appl. No.: 538,215

[22] Filed: Oct. 3, 1983

[30] Foreign Application Priority Data

Nov. 2, 1982 [DE] Fed. Rep. of Germany ....... 3240352

[51] Int. Cl.⁴ ..................... H03K 17/04; H03K 17/64
[52] U.S. Cl. .................................. 307/254; 307/246; 307/268; 307/270; 307/494
[58] Field of Search ............. 307/246, 253, 270, 494, 307/254, 264, 268, 300, 315; 323/222, 289

[56] References Cited
U.S. PATENT DOCUMENTS 3,390,282 6/1968 Cancro et al. ................. 307/268 X
3,480,799 11/1969 Tschudi ........................ 307/268 X
3,787,738 1/1974 Horwath ....................... 307/268
4,224,535 9/1980 Wilson et al. .................. 307/270
4,414,479 11/1983 Foley ........................... 307/253
4,480,201 10/1984 Jaeschke ...................... 307/270 X

OTHER PUBLICATIONS

Williams et al, "High-Voltage High-Frequency Power-Switching Transistor Module with Switching-Aid-Circuit Energy Recovery", IEEE Proceedings, vol. 131, Pt. B, No. 1, Jan. 1984, pp. 7–12.

Primary Examiner—Stanley D. Miller
Assistant Examiner—D. R. Hudspeth
Attorney, Agent, or Firm—Wayne B. Easton

[57] ABSTRACT

The invention relates to an electronic switching circuit having a power transistor controlled by a control stage. During the "on" time for the transistor a capacitor of a switch off relief circuit is charged and at "turn-off" time the capacitor is discharged through the base-emitter path of the power transistor. The charge of the capacitor is thus utilized to produce a strong base current surge during switching on of the power transistor so as to operate the power transistor rapidly and thereby reduce the power loss of its switching path.

1 Claim, 6 Drawing Figures

LOW POWER LOSS SNUBBER FOR SWITCHING POWER TRANSISTORS

The invention relates to electronic switching apparatus comprising a power transistor controlled by a control stage as a switching element, a switch-off relief circuit containing a series circuit of a condenser and a diode poled in the same sense as the power transistor, and a discharge path which by-passes the collector-emitter path of the power transistor and comprises a discharge resistor for the condenser and a discharge transistor operated simultaneously with the power transistor, the condenser and diode series circuit being in parallel with the collector-emitter path of the power transistor, and possibly a recovery diode poled reversely to the pass direction of the power transistor.

In a known switching apparatus of this kind, the discharge resistor is a transformer in series with the discharge transistor parallel to the condenser. In order that the condenser can, for switching the power transistor off, bring about the desired switch-off relief by slow charging, it must be discharged before switching off.

After switching off, however, it has a voltage. It must therefore be discharged again before the next switching off. This occurs on switching on the power transistor by way of the transformer and the collector-emitter path of the discharge transistor. The discharge current does therefore not, as in other known cases, flow through the switching path (collector-emitter path) of the power transistor so that the switching path is not additionally loaded by the discharge current and the power loss of the power transistor is kept low. The secondary voltage of the transformer is returned to the operating power source to avoid substantially the energy losses caused by discharging of the condenser.

The invention is based on the problem of providing a switching apparatus of the aforementioned kind in which the losses are further reduced.

According to the invention, this problem is solved in that the discharge current of the condenser is led through the base-emitter path of the power transistor.

In this solution, the charge of the condenser is utilised to produce a strong base current surge during switching on of the power transistor so as to operate the power transistor rapidly and thereby reduce the power loss of its switching path. After this surge of current, the base current behaves according to the normal control signal.

Since the switching on current would otherwise have to be taken from a further energy source, utilisation of the condenser charge achieves a saving in energy in the control circuit and thus a higher overall efficiency with simple circuitry.

In a particularly favourable embodiment, the base-emitter path of the power transistor is disposed in the discharge path of the condenser. In particular, the collector-emitter path of the discharge transistor can be disposed between the collector and base of the power transistor and the discharge resistor can be an ohmic resistor. This enables direct utilisation of the condenser charge as base current and dispensing with an expensive transformer.

Further, the power transistor may be connected to a control transistor, especially for high voltages, in Darlington circuit and the discharge resistor may be connected direct to the collector of the control transistor and by way of a diode poled in the pass direction of the control transistor to the collector of the power transistor. In this case the control transistor at the same time forms the discharge transistor for the condenser whereas the diode poled in the pass direction of the control transistor and disposed between the collectors of the two transistors on the one hand prevents discharge of the condenser through the power transistor and on the other hand maintains current flow through the control transistor when the condenser discharge is complete before the end of the switch-on control signal. Here, again, the discharge current of the condenser forms at least part of the base current of the control transistor, which initially increases the base current so that the power transistor is operated rapidly.

Further, the power transistor can be controlled depending on the charged condition of the condenser such that the power transistor can be switched off only with the condenser discharged. This ensures that the condenser is certain to be adequately discharged before the power transistor is switched off.

The voltage of the condenser may in this case be applied to one input of a comparator and a reference voltage to the other input, and the signal fed to the control input of the power transistor may be derived from an OR linkage of the comparator output signal and a control signal for the power transistor. If, then, for switching off the power transistor the switch-on control signal disappears before the condenser has discharged, the power transistor remains conductive until the condenser has discharged sufficiently. The switch-on control signal need therefore not be maintained until the condenser has sufficiently discharged. Instead, a short switch-on control signal will suffice. Nevertheless, the conductive condition of the power transistor is maintained until there is sufficient discharge. In this way one can work with a low control power. On the other hand, with a shorter discharge time of the condenser than the duration of a switch-on control pulse, the conductive state of the power transistor can also be maintained up to the end of the switch-on control pulse.

The invention will now be described in more detail with reference to preferred examples shown in the drawing, wherein.

Figure 1:
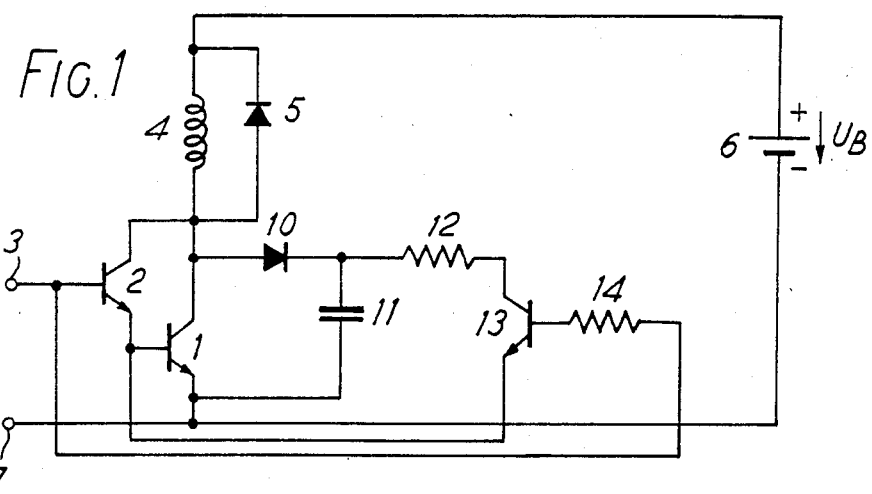
FIG. 1 illustrates a first embodiment of a switching apparatus according to the invention applied to a single phase consumer.

In the FIG. 1 example, the switching apparatus contains a power transistor 1 as the switching element. The base of power transistor 1 is connected to the emitter and the collector of the power transistor to the collector of a control transistor 2 of which the base is connected to a control terminal 3. In series with power transistor 1 there is an inductive consumer 4 with a recovery diode 5 in parallel. The series circuit of consumer 4 and power transistor 1 is applied to an operating voltage source 6 which produces a D.C. voltage $U_B$. The emitter of power transistor 1 is connected to a second control terminal 7, the control terminals 3 and 7 defining the control input of transistors 1 and 2. The control terminals are fed with control signals in the form of square pulses from a control stage (not shown).

Parallel to the collector-emitter path of power transistor 1 there is a series circuit of a diode 10 and a condenser 11, the diode being poled in the same sense as power transistor 1. Parallel to the series circuit of condenser 11 and base-emitter path of power transistor 1, there is a discharge path containing an ohmic discharge resistor 12 in series with the collector-emitter path of a discharge transistor 13. The base of discharge transistor 13 is connected to the control terminal 3 by way of an ohmic pre-resistor 14.

Figure 3:
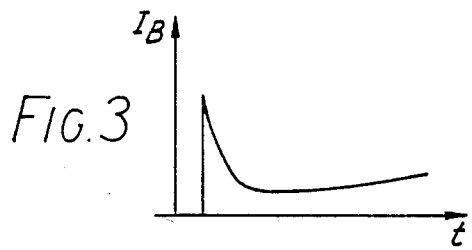
FIG. 3 is a graph of the base current of the power transistor against time.

Whilst the conductive transistors 1, 2 and 13 are "switched off" (blocked) by removing a switch-on control pulse from the input 3,7, condenser 11 slowly charges to the operating voltage $U_B$ by way of the consumer 4 and diode 10 while the collector current is still decaying. Charging takes place so slowly that, even at a considerably lower charging voltage of condenser 11 than that corresponding to operating voltage $U_B$, the collector current of power transistor 1 has decayed to zero and the power transistor 1 is fully blocked. The power produced in transistor 1 during decay of the collector current is therefore much less than without the condenser 11. Without condenser 11, on removal of the switch-on control pulse from the control input 3, 7, the collector-emitter voltage at the power transistor would rise practically without delay because, by reason of the inductivity of consumer 4, the consumer current would rapidly be commutated to the recovery diode 5. A sudden rise in collector-emitter voltage of the power transistor 1 with the collector current still substantially unreduced would lead to a corresponding high load on power transistor 1. Condenser 11 prevents this sudden rise in the collector-emitter voltage of power transistor 1 and thus its overloading. However, in order that condenser 11 can retard the voltage rise by its charging, it must have discharged previously. This occurs on switching the power transistor on by a switch-on control pulse at input 3, 7. This pulse is also fed to the base of discharge transistor 13, so that all transistors 1, 2 and 13 are immediately "switched on" (operated). The condenser does not discharge as in known cases by way of the switching path of power transistor 1 but through the discharge resistor 12, discharge transistor 13 and the base-emitter path of power transistor 1. The discharge current therefore does not flow in addition to the consumer current through the collector-emitter path of power transistor 1 but through its own discharge path, i.e. without additionally placing a load on the switching path of power transistor 1. Instead, the discharge current is added to the flow in the base-emitter path of power transistor 1. Its base current $I_B$ is therefore very much higher on commencement of the switch-on control pulse during discharge of the condenser, as shown in FIG. 3. This initial base current ensures that power transistor 1 is operated quickly and its losses are thereby reduced. In addition, the control power of the control stage can be correspondingly reduced.

Figure 2:
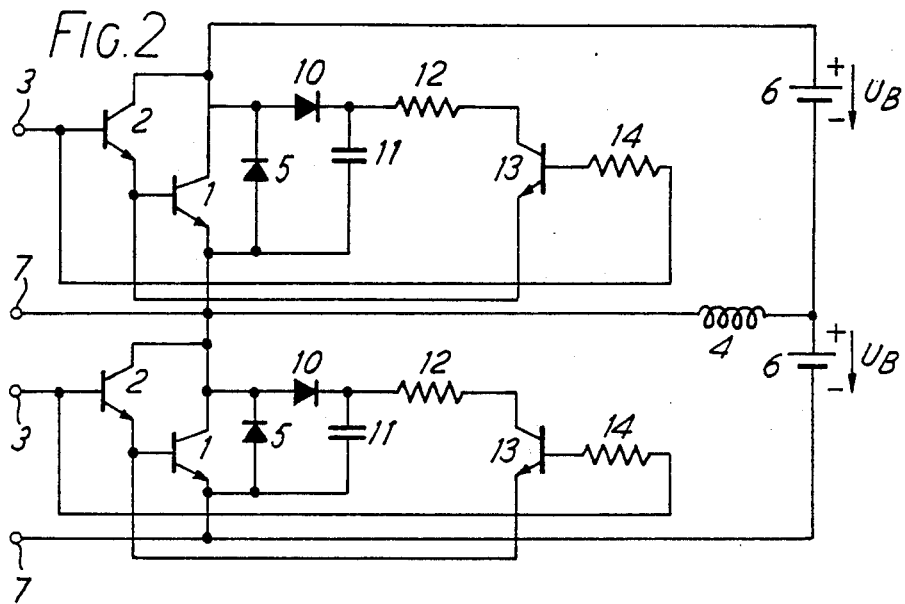
FIG. 2 shows the FIG. 1 example applied to a two-phase inverse rectifier.

FIG. 2 shows a different use of the FIG. 1 switching apparatus for a two-phase inverse rectifier. In this case the two power transistors 1 are "switched on" alternately by way of the control terminals 3, 7 so that the consumer current flows alternately through the consumer 4 from the upper and lower operating voltage source 6 in alternating directions. The recovery diodes 5 are disposed parallel to the collector-emitter path of the power transistors 1. Since, directly after switching one of the power transistors off, the other must not be switched on to avoid a short circuit, the inductive consumer 4 drives, immediately after the one power transistor has been switched off, a recovery or feedback current through the recovery diode 5 parallel to the other power transistor so long as the latter remains switched off (blocked).

In this example it is also possible to control the transistors 1, 2 so that during the blocked condition of the one switching path, the other is "pulsed", i.e. alternately switched on and off at a high control pulse frequency, and vice verse, to regulate the mean value of the consumer current. With such operation, discharging of condensers 11 over discharge paths independent of the switching paths is particularly favourable because the condenser 11 parallel to the blocked power transistor 1 does not change its charge on account of that recovery current which flows through the recovery diode 5 parallel to this condenser 11. Without the discharge transistor 13 and with the discharge resistor 12 parallel to diode 10, the condenser 11 parallel to the recovery diode 5 carrying the recovery current would be charged to the pass voltage drop of this recovery diode 5, i.e. opposite to the desired polarity. Recharging to the desired polarity would then have to be taken care of by a current through the other power transistor, which would considerably increase its heat losses.

Figure 4:
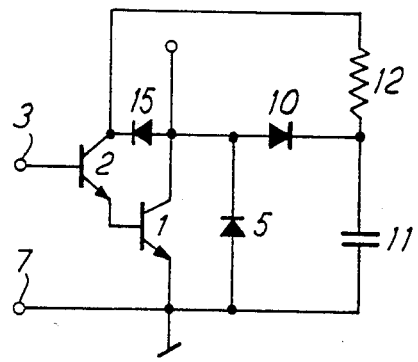
FIG. 4 shows a third embodiment of switching apparatus according to the invention.

In the FIG. 4 example, the additional discharge transistor 13 provided for the preceding examples has been omitted. Instead, the discharge resistor 12 is connected to the collector of the control transistor 2 and a decoupling diode 15 is interposed between the collectors of transistors 1 and 2 so that the control transistor 2 forms the discharge transistor for condenser 11.

Figure 5:
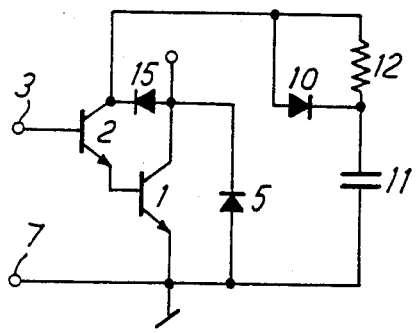
FIG. 5 shows a fourth embodiment of switching apparatus according to the invention.

The FIG. 5 example differs from that of FIG. 4 only in that the anode of diode 10 is not connected to the collector of power transistor 1 but to the collector of control transistor 2. Discharging of condenser 11 through the power transistor 1 therefore continues to be blocked by diode 15 whereas, conversely, charging likewise takes place through the series circuit of both diodes 10 and 15.

Figure 6:
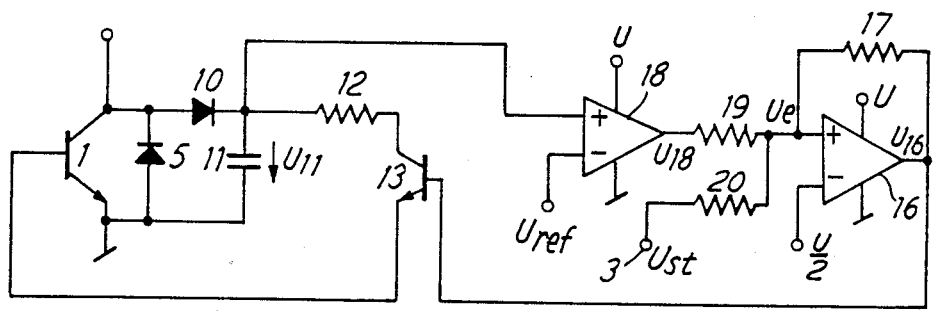
FIG. 6 shows a fifth example of switching apparatus according to the invention.

The FIG. 6 example differs from that of FIG. 5 in that, first, instead of the control transistor 2 an operational or differential amplifier 16 is provided as comparator of which the output is connected to the base of the discharge transistor 13 and, by way of a resistor 17, to its non-inverting input (+). The amplifier 16 is therefore fed back positively, i.e. regeneratively coupled. At the inverting input (−) of the amplifier 16 there is a prevoltage of about U/2, wherein U is the operating voltage of amplifier 16. As soon as voltage $U_e$ at the non-inverting input (+) of amplifier 16 exceeds voltage U/2 at the inverting input of amplifier 16, the output voltage $U_{16}$ of amplifier 16 changes suddenly to U. If, however, voltage $U_e$ at the non-inverting input (+) is below voltage U/2 at the inverting input, output voltage $U_{16}$ of amplifier 16 jumps to zero. Second, voltage $U_{11}$ at condenser 11 is fed to the non-inverting input (+) of a further comparator in the form of an operational or differential amplifier 18, to the inverting input (−) of which a reference voltage $U_{ref}$ is applied. Reference voltage $U_{ref}$ is selected to have a value to which condenser 11 should at least discharge. The output voltage of amplifier 18 likewise assumes the value U or zero, depending on whether condenser voltage $U_{11}$ is larger or smaller than $U_{ref}$, where $U_{ref}$ is near zero, i.e. considerably less than U.

It shall be assumed that transistors 1 and 13 are blocked, voltage $U_{11}$ at condenser 11 is larger than $U_{ref}$ and a switch-on control voltage $U_{st}$ equal to U occurs. Output voltage $U_{18}$ of amplifier 18 is likewise U and voltage $U_e$ at the non-inverting input (+) of amplifier 16 is 2U/3 so long as its output voltage $U_{16}$ is still zero. Since $U_e$ is therefore larger than U/2, amplifier 16 triggers so that $U_{16}$ now becomes equal to U. This has the effect that $U_e$ likewise rises to U and at the same time transistors 1 and 13 are operated. Condenser 11 can therefore discharge through resistor 12, transistor 13 and the base-emitter path of power transistor 1. As soon as condenser voltage $U_{11}$ falls below reference voltage $U_{ref}$, $U_{18}$ becomes zero. If control voltage $U_{st}$ at control terminal 3 remains equal to U, $U_e$ drops to 2U/3 again but remains larger than U/2 so that $U_{16}$ retains the value U and both transistors remain conductive. Only when $U_{st}$ disappears, i.e. becomes zero, will $U_e$ drop to U/3 so that $U_e$ becomes less than U/2 and amplifier 16 triggers back, i.e. $U_{16}$ becomes equal to 0 and so does $U_e$. Only now are both transistors 1 and 13 blocked and condenser 11 can be charged to the operating voltage again through diode 10 and the consumer (not shown in FIG. 6). $U_{11}$ thereby again exceeds $U_{ref}$ and $U_{18}$ resumes the value U. So long as, or because, $U_{st}$ and $U_{16}$ are still zero, $U_e$ only rises to U/3 so that the prevoltage U/2 is not exceeded and amplifier 16 does not trigger. It is only when $U_{st}$ reoccurs, i.e. assumes value U, that $U_{16}$ reassumes value U, so that transistors 1 and 13 are operated again and condenser 11 discharges again. Should $U_{st}$ disappear before condenser 11 has discharged to such an extent that $U_{11}$ drops below value $U_{ref}$, $U_e$ will drop to 2U/3 but remains larger than U/2 so that $U_{16}$ remains equal to U and condenser 11 can continue to discharge to below $U_{ref}$. Only now does $U_{16}$ disappear and transistors 1 and 13 become blocked again. This ensures that, independently of the duration of the respective switch-on control signal $U_{st}$ equal to U, is discharged at least to the desired voltage $U_{ref}$ before the discharge transistor 13 is blocked. On the other hand, power transistor 1 also remains conductive until condenser 11 has at least discharged to $U_{ref}$. If the switch-on control voltage lasts longer than the discharging step, condenser 11 can discharge to beyong $U_{ref}$. Keeping power transistor 1 conductive after the disappearance of the switch-on control voltage until condenser 11 has discharged to $U_{ref}$ ensures that the permissible switching on load on power transistor 1 is not exceeded, even if discharging takes longer than the duration of the switching-on control voltage. On the other hand, one can work with a short switching-on pulse $U_{st}$, shorter than the discharge time of condenser 11. The power transistor nevertheless remains conductive until condenser 11 has been sufficiently discharged. This represents a saving in control power.

The discharge transistor 13 as well as the power transistor 1 is thus kept conductive for as long as $U_{11}$ exceeds $U_{ref}$ or $U_{st}$ is equal to U or both conditions are fulfilled. A comparator arrangement monitoring the charged condition of condenser 11 as in FIG. 6 may also be provided for the other embodiments.

We claim:

1. An electronic switching circuit comprising a power transistor having a collector, base and emitter, diode means poled to conduct current in the same direction as the collector-emitter current path of said transistor connected to said collector, capacitor means connected between said diode means and said emitter, discharge resistor means connected to a junction of said diode means and said capacitor means, transistor means coupled between said discharge resistor means and said power transistor base poled to conduct current in the same direction as the collector-emitter path of said power transistor base to effect a discharge of said capacitor through the base-emitter path of said power transistor, and control means operating said transistor means, said transistor means including a discharge transistor having its collector connected to said discharge resistor means and its emitter connected to said base of said power transistor, said control means including comparator means for controlling said power transistor depending on the charged condition of said capacitor means so that said power transistor can be switched off only when said capacitor is discharged, said comparator means having one input thereof connected to said capacitor means and the output thereof connected to said transistor base, and the other input of said comparator means being coupled to receive control signals for said power transistor.

* * * * *